(12) United States Patent
Upadhyaya et al.

(10) Patent No.: US 8,269,566 B2
(45) Date of Patent: Sep. 18, 2012

(54) TUNABLE RESONANT CIRCUIT IN AN INTEGRATED CIRCUIT

(75) Inventors: Parag Upadhyaya, San Jose, CA (US); Vassili Kireev, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 43 days.

(21) Appl. No.: 12/906,017

(22) Filed: Oct. 15, 2010

(65) Prior Publication Data

US 2012/0092081 A1  Apr. 19, 2012

(51) Int. Cl.
*H03B 5/12* (2006.01)
(52) U.S. Cl. ............ 331/117 R; 331/179; 331/167
(58) Field of Classification Search .......... 331/179, 331/117 FE, 167, 177 V, 36 C, 117 R
See application file for complete search history.

(56) References Cited

U.S. PATENT DOCUMENTS

| | | | |
|---|---|---|---|
| 6,720,835 B2* | 4/2004 | Fujita | 331/117 R |
| 7,230,504 B1 | 6/2007 | Marques et al. | |
| 7,569,912 B2* | 8/2009 | Sze et al. | 257/595 |
| 2002/0040991 A1 | 4/2002 | Embabi et al. | |
| 2003/0062559 A1 | 4/2003 | Tamaki | |

FOREIGN PATENT DOCUMENTS

WO  WO 2005-104347 A1  11/2005

OTHER PUBLICATIONS

Subbanna, S. et al., Silicon-Germanium BICMOS Technology and A Cad Environment for 2-40 GHz VLSI Mixed-Signal ICS pp. 559-566, IEEE 2001 Custom Integrated Circuits Conference, May 6-9, 2001.

* cited by examiner

*Primary Examiner* — Joseph Chang
(74) *Attorney, Agent, or Firm* — LeRoy D. Maunu (57) ABSTRACT

A tunable resonant circuit includes first and second capacitors that provide a matched capacitance between first and second electrodes of the first and second capacitors. A deep-well arrangement includes a first well disposed within a second well in a substrate. The first and second capacitors are each disposed on the first well. Two channel electrodes of a first transistor are respectively coupled to the second electrode of the first capacitor and the second electrode of the second capacitor. Two channel electrodes of a second transistor are respectively coupled to the second electrode of the first capacitor and to ground. Two channel electrodes of the third transistor are respectively coupled to the second electrode of the second capacitor and to ground. The gate electrodes of the first, second, and third transistors are responsive to a tuning signal, and an inductor is coupled between the first electrodes of the first and second capacitors.

19 Claims, 4 Drawing Sheets

TUNABLE RESONANT CIRCUIT IN AN INTEGRATED CIRCUIT

FIELD OF THE INVENTION

One or more embodiments generally relate to LC tank circuits, and more particularly to tunable resonant circuits implemented in an integrated circuit.

BACKGROUND

Resonant circuits are useful for various applications, such as filters and oscillators. The frequency of resonance can be adjusted in tunable resonant circuits to track application requirements and/or to compensate for variations in the manufacturing process, operating temperature, and operating voltage.

It has generally been recognized that there is a need to increase the range of tuning of resonant circuits. However, parasitic circuit elements generally limit the turning range of resonant circuits. One or more embodiments of the present invention may address one or more of the above issues.

SUMMARY

A tunable resonant circuit is provided in one embodiment. The circuit includes a first and a second capacitor, each including a first and second electrode. The first and second capacitors provide a matched capacitance between the first and second electrodes of the first capacitor and the first and second electrodes of the second capacitor. At least one deep-well arrangement includes a first well disposed within a second well that is disposed within a substrate of an integrated circuit. The first and second capacitors are each disposed on the first well of the at least one deep-well arrangement. First, second, and third transistors are disposed in the integrated circuit and each includes a gate electrode and two channel electrodes. The two channel electrodes of the first transistor are respectively coupled to the second electrode of the first capacitor and the second electrode of the second capacitor. The two channel electrodes of the second transistor are respectively coupled to the second electrode of the first capacitor and to ground. The two channel electrodes of the third transistor are respectively coupled to the second electrode of the second capacitor and to ground. The gate electrodes of the first, second, and third transistors are responsive to a tuning signal, and an inductor is coupled between the first electrode of the first capacitor and the first electrode of the second capacitor.

In another embodiment, a tunable resonant circuit includes a plurality of pairs of first and second capacitors. Each of the first and second capacitors of each pair includes a first and second electrode. The first and second capacitors of each pair provide a matched capacitance between the first and second electrodes of the first capacitor and the first and second electrodes of the second capacitor. A plurality of respective switch sets is provided for the plurality of pairs. The respective switch set for each pair includes a first, second, and third transistor. Each of the first, second, and third transistors includes a gate electrode and two channel electrodes. The two channel electrodes of the first transistor of the respective switch set for each pair are respectively coupled to the second electrode of the first capacitor of the pair and to the second electrode of the second capacitor of the pair. The two channel electrodes of the second transistor of the respective switch set for each pair are respectively coupled to the second electrode of the first capacitor of the pair and to ground. The two channel electrodes of the third transistor of the respective switch set for each pair are respectively coupled to the second electrode of the second capacitor of the pair and to ground. The gate electrodes of the first, second, and third transistors of the respective switch set for each pair are responsive to a respective one of a plurality of tuning signals. An inductor includes two electrodes respectively coupled to the first electrode of the first capacitor of each pair and the first electrode of the second capacitor of each pair.

A variable oscillator is provided in another embodiment. The variable oscillator includes a plurality of pairs of first and second capacitors. The first and second capacitors of each pair provide a matched capacitance. A plurality of respective switch sets is provided for the plurality of pairs. The respective switch set for each pair includes a first transistor that selectively couples and decouples the first and second capacitors of the pair. The first transistor of the respective switch set for each pair is responsive to a respective tuning signal of a plurality of tuning signals. An inductor, for each pair of the plurality of pairs, is coupled across a series combination of the first capacitor of the pair, the first transistor of the respective switch set for the pair, and the second capacitor of the pair. Two cross-coupled transistors are coupled across the inductor.

It will be appreciated that various other embodiments are set forth in the Detailed Description and Claims which follow.

BRIEF DESCRIPTION OF THE DRAWINGS

Various aspects and advantages of the embodiments will become apparent upon review of the following detailed description and upon reference to the drawings in which.

DETAILED DESCRIPTION OF THE DRAWINGS

Figure 1:
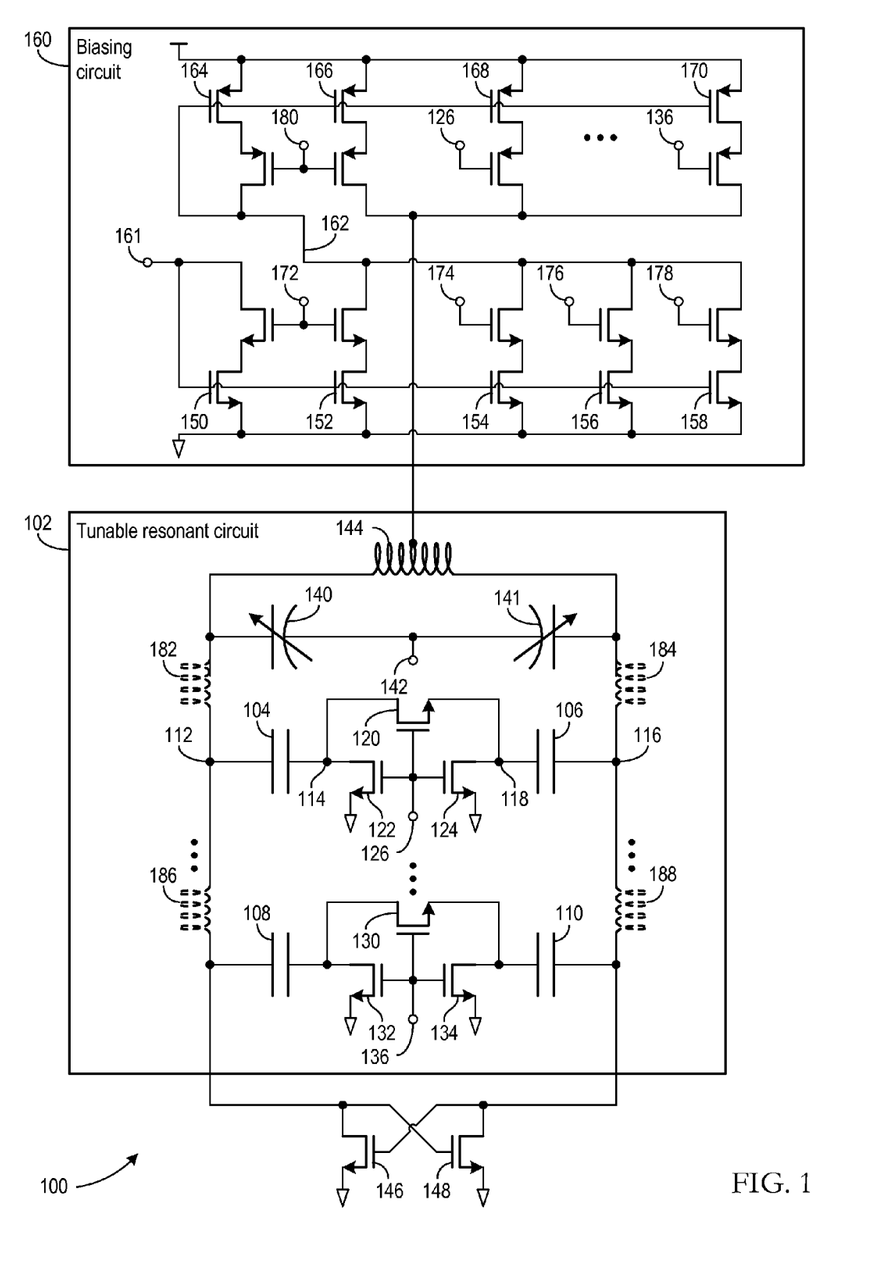
FIG. 1 is a circuit diagram of a variable oscillator including a tunable resonant circuit in accordance with one or more embodiments of the invention.

FIG. 1 is a circuit diagram of a variable oscillator 100 including a tunable resonant circuit 102 in accordance with one or more embodiments of the invention. The resonance frequency of the tunable resonant circuit 102 sets the frequency of the variable oscillator 100. Thus, the frequency of the variable oscillator 100 is adjusted by tuning the resonance frequency of the tunable resonant circuit 102.

The tunable resonant circuit 102 includes multiple pairs of capacitors, for example, the pair of capacitors 104 and 106 through a pair of capacitors 108 and 110. The capacitance that capacitor 104 provides between its electrodes 112 and 114 matches the capacitance that capacitor 106 provides between its electrodes 116 and 118. Similarly, the pair of capacitors 108 and 110 has matched capacitance.

Each capacitor pair has an associated switch set. The pair of capacitors 104 and 106 has an associated switch set that includes transistors 120, 122, and 124. The gate electrodes of transistors 120, 122, and 124 are connected to a tuning signal 126. The channel electrodes of transistor 120 are connected between electrode 114 of capacitor 104 and electrode 118 of capacitor 106. The channel electrodes of transistor 122 are connected between electrode 114 of capacitor 104 and ground, and the channel electrodes of transistor 124 are connected between electrode 118 of capacitor 106 and ground.

The tuning signal 126 controls transistors 120, 122, and 124. When the control voltage of tuning signal 126 exceeds the threshold voltages of transistors 122 and 124, transistors 122 and 124 set the channel electrodes of transistor 120 to the bias voltage of ground. When the control voltage of tuning signal 126 exceeds this bias voltage by more than the threshold voltage of transistor 120, then transistor 120 couples the electrode 114 of capacitor 104 to the electrode 118 of capacitor 106. In contrast, when the control voltage of tuning signal 126 does not exceed the threshold voltages of transistors 120, 122, and 124, then transistor 120 does not couple capacitors 104 and 106. Thus, transistors 120, 122, and 124 selectively couple or decouple capacitors 104 and 106 depending on the control voltage of tuning signal 126. Similarly, transistors 130, 132, and 134 selectively couple or decouple the pair of capacitors 108 and 110 in response to tuning signal 136.

Varactor diodes 140 and 141 provide matched capacitances that are continuously variable in response to a tuning signal 142. The control electrodes of the varactor diodes 140 and 141 are coupled together and to the tuning signal 142, and the inductor 144 is coupled across the series combination of varactor diodes 140 and 141. When the switch sets decouple all of capacitors 104 and 106 through 108 and 110, tunable resonant circuit 102 resonates between the inductance of inductor 144 and the capacitance of varactor diodes 140 and 141 together with certain parasitic capacitances. Thus, varactor diodes 140 and 141 tune the oscillation frequency of variable oscillator 100 when the switch sets decouple all of capacitors 104 and 106 through 108 and 110. When the switch sets instead couple some or all of the capacitors 104 and 106 through 108 and 110, varactor diodes 140 and 141 fine tune the resonance of tunable resonant circuit 102 and the oscillation frequency of variable oscillator 100.

The tunable resonant circuit 102 has symmetry that produces differential operation. For example, because capacitors 104 and 106 have a matched capacitance, during oscillation of tunable resonant circuit 102 the voltage at electrode 114 is rising when the voltage at electrode 118 is falling at the same rate, and vice versa. While tuning signal 126 exceeds the threshold voltages of transistors 122 and 124, transistors 122 and 124 set the common mode to ground for the differential oscillations between electrodes 114 and 118. Thus, the differential voltage across the channel electrodes of transistor 120 is twice the voltage at electrodes 114 and 118 individually, and for a specified amount of channel resistance, the size of transistor 120 is half the size that would be required for transistors (such as transistors 122 and 124) that do not operate differentially.

In one embodiment, transistors 122 and 124 are small transistors setting the DC bias voltage of the channel electrodes of transistor 120, and transistor 120 is a relatively large transistor sized to provide a channel resistance during differential conduction that matches a target channel resistance. Because capacitors 104 and 106 block any DC paths to electrodes 114 and 118, transistors 122 and 124 can be very small transistors that only conduct leakage currents to set the bias voltage at the channel electrodes of transistor 120.

The quality factor, Q, for the LC tunable resonant circuit 102 is the ratio of its reactance to its resistance. The quality factor gives the resonance bandwidth, and the frequency jitter of variable oscillator 100 reduces with increasing quality factor of the tunable resonant circuit 102. In one embodiment, transistors 120 and 130 are sized to have a channel resistance during differential conduction that matches a target channel resistance given by the target Q.

For the variable oscillator 100, the tuning range is given by the maximum achievable capacitance and inductance and by the minimum achievable capacitance and inductance. The maximum achievable capacitance is the matched capacitances of varactor diodes 140 and 141, and capacitors 104 and 106 through capacitors 108 and 110. Although capacitors 104 and 106 through 108 and 110 are disconnected from the resonating circuit when tuning signals 126 and 136 turn off transistors 120, 122, and 124 through transistors 130, 132, and 134, capacitors 104 and 106 through 108 and 110 still contribute to the minimum achievable capacitance through certain parasitic capacitances present in an actual implementation of the tunable resonant circuit 102. For example, capacitor 104 provides a parasitic capacitance to ground, and capacitor 104 is in series with a parasitic capacitance of transistor 120.

Various embodiments of the invention reduce the minimum achievable capacitance and increase the maximum achievable inductance to extend the tuning range of the resonant circuit 102 and thereby extend the frequency range of variable oscillator 100.

The differential operation of tunable resonant circuit 102 helps reduce the minimum achievable capacitance. Because transistor 120 differentially couples capacitors 104 and 106, transistor 120 is half the size that would be required for an implementation that does not operate differentially. Cutting the size of transistor 120 in half also cuts the parasitic capacitances of transistor 120 in half. This reduces the minimum achievable capacitance and extends the tuning range of the resonant circuit 102. Note that transistors 122 and 124 have small parasitic capacitances because transistors 122 and 124 are small transistors.

Biasing circuit 160 produces a current bias for the cross-coupled transistors 146 and 148. Basing circuit 160 delivers the current bias to cross-coupled transistors 146 and 148 through a center tap of inductor 144. The cross-coupled transistors 146 and 148 provide a negative resistance that enables oscillation when the negative resistance equals or exceeds the resistances in the tunable resonant circuit 102. Biasing circuit 160 produces a current bias that adjusts the negative resistance that cross-coupled transistors 146 and 148 produce.

Biasing circuit 160 includes two sets of current mirrors. The first set of current mirrors 150, 152, 154, 156, and 158 scales a reference bias from reference signal 161 to produce an operating-point bias on line 162, and the second set of current mirrors 164, 166, 168 through 170 scales the operating-point bias to produce the current bias for the cross-coupled transistors 146 and 148.

Scaling signals 172, 174, 176, and 178 control the first set of current mirrors 150, 152, 154, 156, and 158. Scaling signal 172 enables and disables current mirrors 150 and 152, and an enabled current mirror 152 produces a minimum operating-point bias that is equal to (or a scaling of) the reference bias. Similarly, scaling signals 174, 176, and 178 enable and disable current mirrors 154, 156, and 158, respectively.

In one embodiment, current mirror 154 is the same size as current mirror 152, current mirror 156 is twice the size of current mirror 152, and current mirror 158 is four times the size of current mirror 152. Thus, current mirrors 152, 154, 156, and 158 produce the operating-point bias that is the reference current scaled by various powers of two.

Independently, tuning signals 180 and 126 through 136 control the second set of current mirrors 164, 166, 168, and 170. Tuning signal 180 enables and disables current mirrors 164 and 166, and tuning signals 126 though 136 enable and disable current mirrors 168 through 170.

In one embodiment, the tuning signal 126 controlling current mirror 168 is the same tuning signal controlling transistors 120, 122, and 124; and the tuning signal 136 controlling current mirror 170 is the same tuning signal controlling transistors 130, 132, and 134. When tuning signals 126 through 136 selectively decouple all pairs of capacitors 104 and 106 through 108 and 110, an enabled current mirror 166 sets the current bias for the cross-coupled transistors 146 and 148 equal to (or a scaling of) the operating-point bias from the first set of current mirrors 150, 152, 154, 156, and 158. When tuning signal 126 couples capacitors 104 and 106, current mirror 168 is enabled and adds a scaling of the operating-point bias to the current bias. Current mirror 168 is sized to produce an additional current bias causing cross-coupled transistors 146 and 148 to produce a negative resistance that compensates for the resistance though the series combination of capacitor 104, transistor 120, and capacitor 106. Similarly, current mirror 170 is sized to produce an additional current bias that compensates for the resistance through the series combination of capacitor 108, transistor 130, and capacitor 110. Thus, current mirrors 166 and 168 through 170 produce the current bias for cross-coupled transistors 146 and 148 that is the operating-point current scaled to compensate for resistances including the channel resistances of transistors 120 through 130. The resistance varies with frequency, therefore, controls 126 and 136, which control the frequency of the resonant circuit, also set the current bias to compensate for the resistance variation.

The current bias from biasing circuit 160 also helps vary the achievable capacitance for tunable resonant circuit 102. The cross-coupled transistors 146 and 148 have parasitic capacitances from their gate electrodes to ground that increases as their gate voltages increase. As the current bias increases, the gate voltage of cross-coupled transistors 146 and 148 increases, which in turn increases the parasitic capacitances from the gate electrodes of cross-coupled transistors 146 and 148 to ground. The current bias increase also increases the negative resistance produced by the cross-coupled transistors 146 and 148 which increases the oscillation amplitude. Thus, the current bias should provide enough negative resistance to ensure oscillation, but the current bias should not provide more negative resistance because this increases the parasitic capacitances of cross-coupled transistors 146 and 148 to ground.

In one embodiment, scaling signals 172, 174, 176, and 178 are used to select an operating-point bias that is just sufficient to ensure oscillation when tuning signals 126 through 136 decouple all pairs of capacitors 104 and 106 through 108 and 110. When tuning signals 126 through 136 selectively couple some or all pairs of capacitors 104 and 106 through 108 and 110, current mirrors 164, 166, 168, and 170 scale this operating-point bias to ensure continued oscillation by compensating for the channel resistances of coupling transistors 120 through 130. When all the pairs of capacitors 104 and 106 through 108 and 110 are switched on to get a minimum frequency in the resonant circuit 102, the parasitic resistance in the resonant circuit 102 is higher so current mirrors 168 through 170 are set to increase the current bias. The increased current bias increases the parasitic capacitance to reduce the resonance frequency of the resonant circuit 102. Similarly, when all the pairs of capacitors 104 and 106 through 108 and 110 are switched off to get a maximum frequency in the resonant circuit 102, the parasitic resistance in resonant circuit 102 is lower so current mirrors 168 through 170 are set to decrease the current bias. The reduced current bias reduces the parasitic capacitance to further increase the resonance frequency of the resonant circuit 102.

Additional measures to reduce the minimum achievable capacitance are discussed below in connection in connection with the layout diagrams of FIGS. 2 and 3.

Various embodiments of the invention also increase the maximum achievable inductance to extend the tuning range of resonant circuit 102. In one embodiment, the inductance of inductor 144 is included in both the maximum achievable inductance and the minimum achievable inductance. However, the wiring that connects inductor 144 to the various capacitances and the cross-coupled transistors 146 and 148 has parasitic inductances represented by parasitic inductors 182 and 184 through 186 and 188. The layout of the variable oscillator tends to include these parasitic inductances in the maximum achievable inductance and does not include these parasitic inductances in the minimum achievable inductance. This layout extends the tuning range of the resonant circuit 102 as discussed below.

Figure 2:
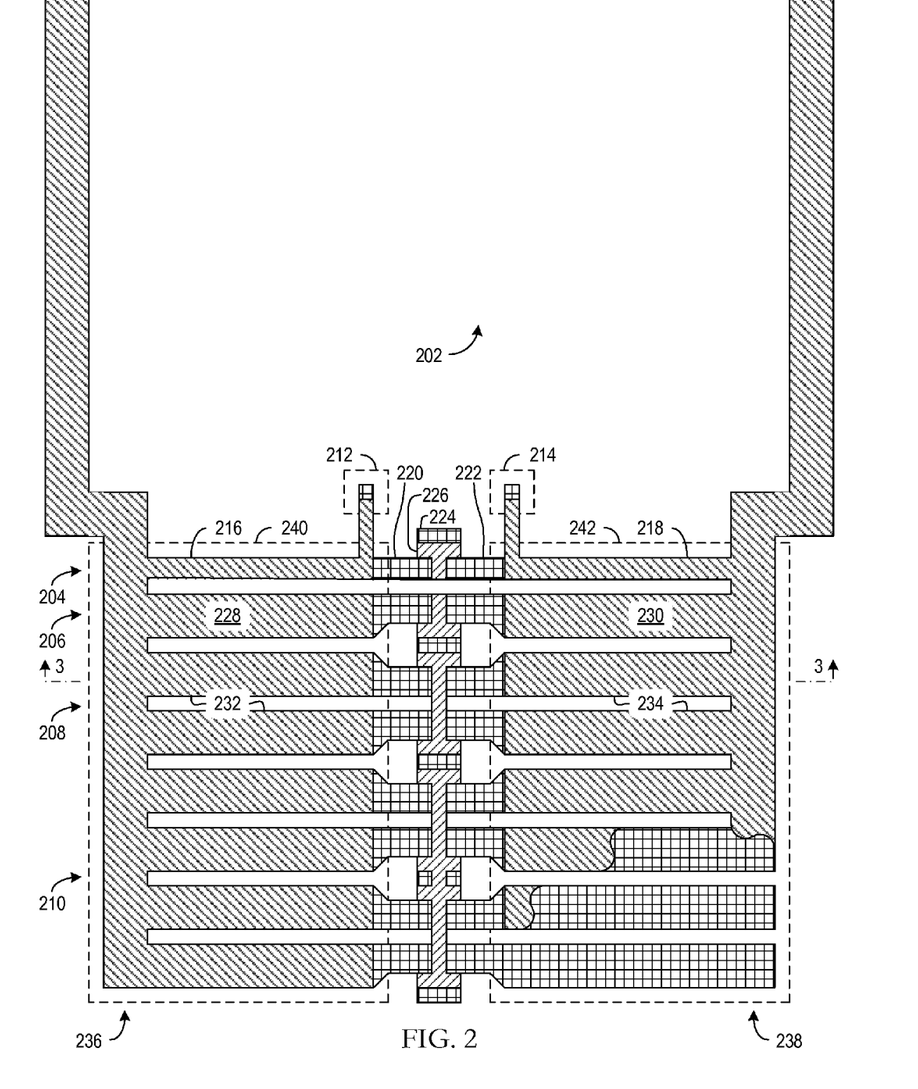
FIG. 2 is a layout diagram of a tunable resonant circuit in accordance with one or more embodiments of the invention.
Figure 3:
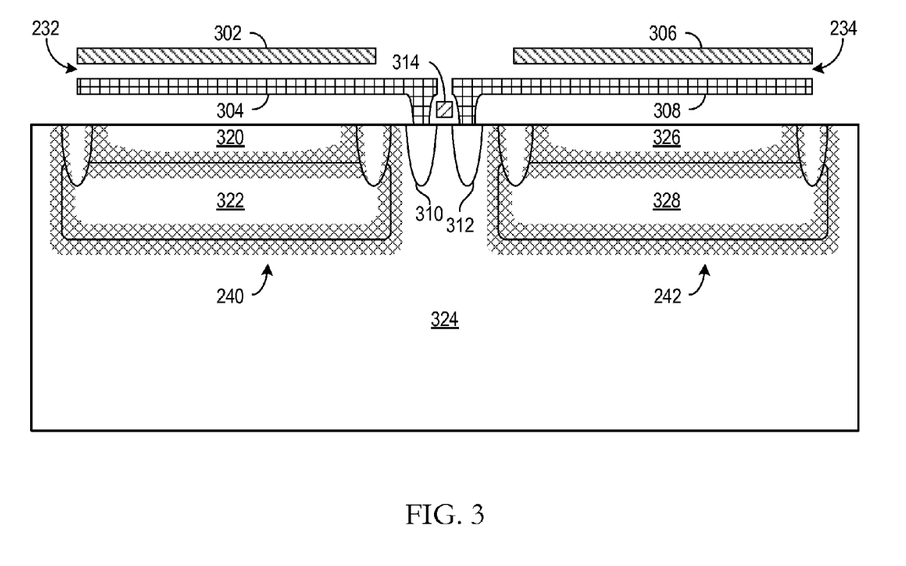
FIG. 3 is a cross-section through the tunable resonant circuit of FIG. 2.

FIG. 2 is a layout diagram of a tunable resonant circuit in accordance with one or more embodiments of the invention. The top half of FIG. 2 includes an inductor 202, and the bottom half includes capacitor pairs 204, 206, 208, and 210. In the center are two varactor diodes 212 and 214.

The capacitor pair 204 includes two parallel plate capacitors 216 and 218 with equal areas providing matching capacitance. Between capacitors 216 and 218 is a switch set of transistors having three metal-covered channel electrodes 220, 222, and 224. Channel electrodes 220 and 222 are connected to an electrode of respective capacitors 216 and 218 on a lower metal layer, and channel electrode 224 is connected to ground. The inductor 202 shares an upper metal layer with another electrode of both capacitors 216 and 218. When the control voltage of the shared gate electrode 226 exceeds a threshold voltage, the channel electrodes 220, 222, and 224 are coupled together. This adds the capacitance of capacitors 216 and 218 to the capacitance resonating with the inductance of inductor 202.

The capacitors 228 and 230 of pair 206 are similarly connected, but the capacitors 228 and 230 have an area that is twice the area of capacitors 216 and 218. Thus, capacitors 228 and 230 provide double the capacitance of capacitors 216 and 218.

An instance of a unit cell provides the pair of capacitors 228 and 230. Instead of the pair 208 of capacitors 232 and 234 being twice the size of pair 206, the pair 208 includes two instances of the unit cell to provide double the capacitance of the pair 206 of capacitors 228 and 230. Similarly, the pair 210 includes four instances of the unit cell to double the capacitance again. The upper metal layer is shown partially cut away in pair 210 to show the extent of the lower metal layer.

In one embodiment, the magnitude of the matching capacitance of capacitor pairs 204, 206, 208, and 210 are binary weighted. In addition, the variable capacitance of the pair of varactor diodes 212 and 214 is adjustable in a range that extends up to at least to the capacitance of pair 204. Thus, the varactor diodes 212 and 214 and the capacitor pairs 204, 206, 208, and 210 provide a continuous range of capacitance from about sixteen times the capacitance of pair 204 down to the minimum capacitance of varactor diodes 212 and 214 plus certain parasitic capacitances.

In another embodiment, the capacitors are finger capacitors instead of parallel plate capacitors. A finger capacitor is implemented in two or more metal layers, and for an integrated circuit fabrication process with twelve metal layers, each finger capacitor is implemented in up to twelve metal layers. Each metal layer includes interleaved "fingers" that alternate between the two electrodes of the finger capacitor. The fingers of adjacent metal layers are offset, such that an interior finger of one capacitor electrode is surrounded to the sizes and above and below by fingers of the other capacitor electrode. This maximizes the capacitance that is produced in a given integrated circuit area for certain fabrication processes.

When all capacitor pairs 204, 206, 208, and 210 are enabled, oscillations of current and voltage resonant between the inductor 202 and all of the capacitor pairs 204, 206, 208, and 210, and this selects a lower resonance frequency for the tunable resonant circuit. The oscillating current flowing through each capacitor pair 204, 206, 208, or 210 is proportional to the matching capacitance of the pair. Thus, the oscillating current flowing through capacitor pair 210 is eight times the oscillating current flowing through capacitor pair 204 in one embodiment. To reach capacitor pair 210, the current flowing through capacitor pair 210 flows from the inductor 202 through the vertical legs 236 and 238. Vertical legs 236 and 238 have parasitic inductances that are represented in FIG. 1 by parasitic inductors 182, 184, 186, and 188. When all capacitor pairs 204, 206, 208, and 210 are enabled, the parasitic inductance of vertical legs 236 and 238 adds to the inductance of inductor 202, and this increases the maximum achievable inductance and lowers the resonance frequency of the tunable resonant circuit. However, on average the total oscillating current flows half-way through vertical legs 236 and 238 when all capacitor pairs 204, 206, 208, and 210 are enabled. Thus, the maximum achievable inductance is the inductance of inductor 202 plus effectively half of the parasitic inductance of vertical legs 236 and 238.

When none of capacitor pairs 204, 206, 208, and 210 are enabled, oscillations of current and voltage resonant between the inductor 202 and the capacitance of the varactor diodes 212 and 214 and various parasitic capacitances, and this selects a higher resonance frequency for the tunable resonant circuit. Essentially none of the oscillating current flows through vertical legs 236 and 238 because capacitor pairs 204, 206, 208, and 210 are all disabled. Thus, the minimum achievable inductance includes the inductance of inductor 202 plus effectively none of the parasitic inductance of vertical legs 236 and 238. The tuning range of tunable resonant circuit is extended because of the parasitic inductances of vertical legs 236 and 238 increase the maximum achievable inductance without affecting the minimum achievable inductance.

In one example, the maximum resonant frequency is the inverse of the period $2\pi\sqrt{L_{MIN}C_{MIN}}$ when all the capacitor pairs 204, 206, 208, and 210 are switched off. Here, $L_{MIN}$ is the inductance of inductor 202, and $C_{MIN}$ is the total parasitic capacitance. The minimum resonant frequency is the inverse of the period $2\pi\sqrt{L_{MAX}C_{MAX}}$ when all capacitor pairs 204, 206, 208, and 210 are switched on. Here, $L_{MAX}$ is the inductance of inductor 202 plus the effective inductance of vertical legs 236 and 238, and $C_{MAX}$ is the total capacitance of the capacitor pairs 204, 206, 208, and 210. Thus, the tuning range of the resonant circuit is extended in various embodiments of the invention because the total parasitic capacitance $C_{MIN}$ is reduced and the effective inductance of vertical legs 236 and 238 adds to $L_{MAX}$.

In one embodiment, the capacitor pairs 204, 206, 208, and 210 are disposed in a layout order corresponding to the range from the minimum magnitude to the maximum magnitude of the matching capacitances of the pairs. This uses the distributed inductance of the inductor 202 and the vertical legs 236 and 238 to lower the frequency of resonance when some or all of the larger capacitor pairs are enabled. Thus, capacitor pair 204 with the minimum capacitance magnitude is disposed proximate to inductor 202, and capacitor pair 210 with the maximum capacitance magnitude is disposed distal from inductor 202. Similarly, the varactor diodes 212 and 214 are disposed proximate to the capacitor pair 204 with the minimum capacitance magnitude and distal from the capacitor pair 210 with the maximum capacitance magnitude.

While FIG. 2 does not show the cross-coupled transistors 146 and 148 of FIG. 1, they can readily be added to the layout of the tunable resonant circuit. The oscillation current resonating in the tunable resonant circuit is roughly the quality factor, Q, times the oscillation current flowing through the cross-coupled transistors. Thus, the oscillation current flowing through the cross-coupled transistors could also flow through vertical legs 236 and 238 without significantly altering the resonance frequency of tunable resonant circuit, especially when Q is high. In one embodiment, the cross-coupled transistors are disposed below capacitor pair 210. In another embodiment, the cross-coupled transistors are disposed near varactor diodes 212 and 214.

In one embodiment, capacitors 216, 228, 232, and the corresponding capacitor of pair 210 are disposed on a deep-well 240, and capacitors 218, 230, 234, and the other capacitor of pair 210 are disposed on a deep-well 242. FIG. 3 is a cross-section through the tunable resonant circuit of FIG. 2 along line 3-3. FIG. 3 illustrates the structure of deep-wells 240 and 242.

Capacitor 232 has a plate electrode 302 in an upper metal layer and a plate electrode 304 in a lower metal layer, and plate electrodes 302 and 304 are separated by a dielectric layer. To clarify the positioning of electrodes 302 and 304, this dielectric layer is shown in FIG. 3 as "white space" between electrodes 302 and 304. Capacitor 232 provides a capacitance between electrodes 302 and 304 that matches the capacitance that capacitor 234 provides between its electrodes 306 and 308.

Between capacitors 232 and 234 is a transistor having channel electrodes 310 and 312 and gate electrode 314. When the control voltage of the gate electrode 314 exceeds a bias voltage of the channel electrodes 310 and 312 by more than the threshold voltage of the transistor, the transistor couples plate electrode 304 of capacitor 232 and plate electrode 308 of capacitor 234.

The deep well 240 is arranged to include a p-type well 320 disposed within an n-type well 322 that is disposed within a p-type substrate 324 of an integrated circuit. Similarly, the deep well 242 is arranged with a p-type well 326 disposed within an n-type well 328 that is disposed within the p-type substrate 324. Capacitor 232 is disposed on the p-type well 320 of deep well 240 and capacitor 234 is disposed on p-type well 326 of deep well 242. In another embodiment, the capacitors are all disposed on the p-type well of a single deep well.

The wells 320 and 322 and the wells 326 and 328 are reverse biased to produce depletion regions across their p-n junctions. These depletion regions are shown cross-hatched in FIG. 3. If the deep well 240 did not exist, the parasitic capacitance of capacitor 232 would be principally the parasitic capacitance between electrode 304 and substrate 324. With the deep well 240 in place, electrode 304 of capacitor 232 has essentially the same parasitic capacitance to p-type well 320. This parasitic capacitance is in series with the junction capacitance across the depletion region between wells 320 and 322 and the junction capacitance across the depletion region between well 322 and substrate 324. The cross-hatched depletion regions are thick and the junction capacitances are correspondingly small with controlled doping and voltage biasing of the wells 320 and 322 and the substrate 324.

Thus, the parasitic capacitance from electrode 304 to substrate 324 is the capacitance of the series combination of the parasitic capacitance from electrode 304 to p-type well 320, the junction capacitance from p-type well 320 to n-type well 322, and the junction capacitance from n-type well 322 to p-type substrate 324. The series combination of these three capacitances has a total capacitance that is the inverse of the sum of the inverses of these three capacitances. This total capacitance is less than the smallest of the three individual capacitances. Deep well 242 similarly reduces the parasitic capacitance from electrode 308 of capacitor 234 to substrate 324. Thus, deep wells 240 and 242 dramatically reduce the parasitic capacitance of electrodes 304 and 308. When a tuning signal applied to gate electrode 314 turns its transistor off, the pair of capacitors 232 and 234 has a residual capacitance that is principally the series combination of the capacitances of capacitors 232 and 234 and the parasitic capacitances from electrodes 304 and 308 to substrate 324. This residual capacitance is approximately half the parasitic capacitance from electrodes 304 or 308 to the substrate 324 through deep wells 240 or 242.

Because the deep wells 240 and 242 dramatically reduce the residual capacitance of the pair of capacitors 232 and 234 when the pair is not coupled by the transistor with gate electrode 314, the deep wells 240 and 242 reduce the minimum achievable capacitance of the tunable resonant circuit. This extends the tuning range for the resonance frequency of the tunable resonant circuit.

Figure 4:
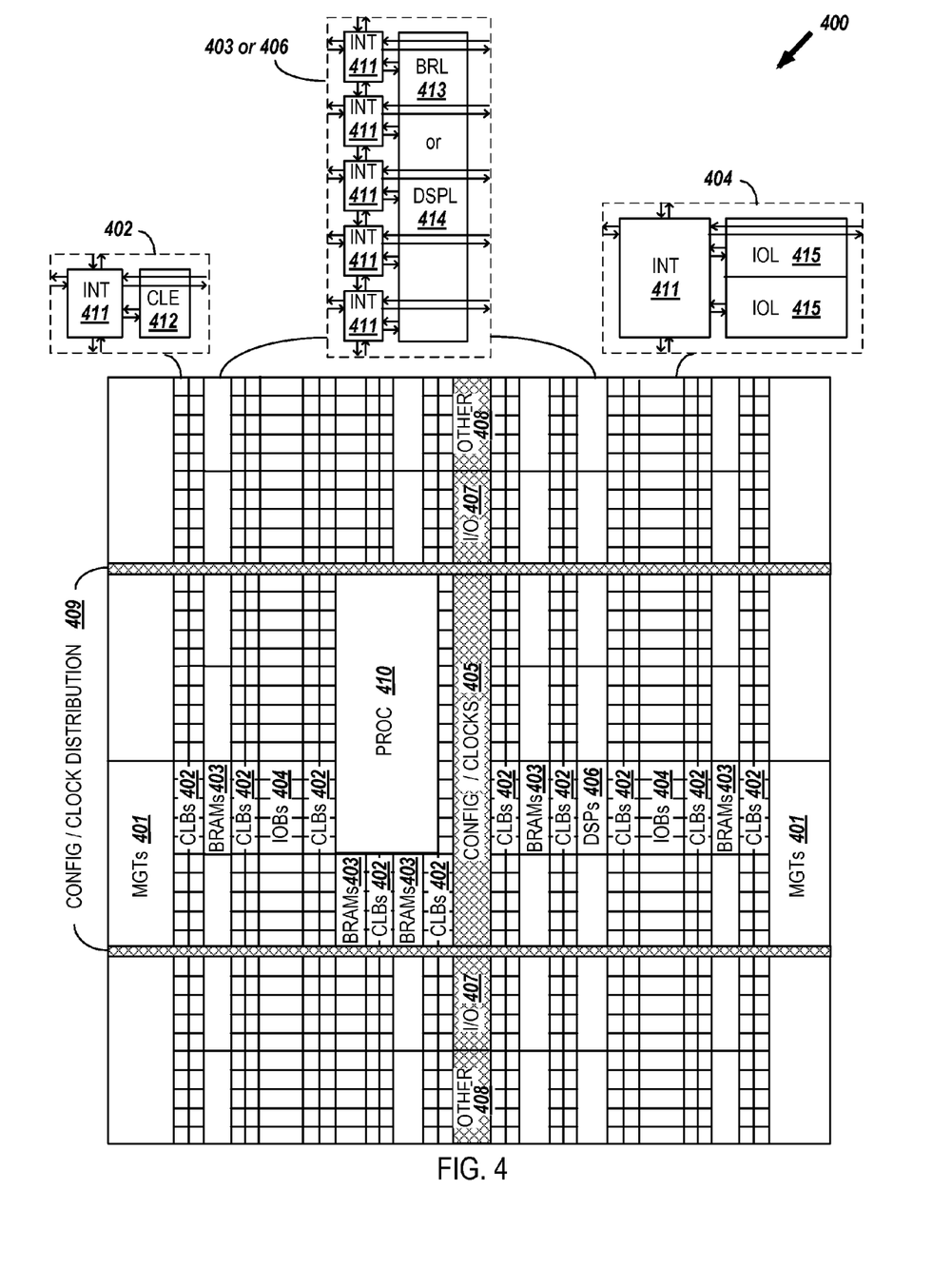
FIG. 4 is a block diagram of an example programmable logic integrated circuit that implements a tunable resonant circuit in accordance with one or more embodiments of the invention.

FIG. 4 is a block diagram of an example programmable logic integrated circuit that implements a tunable resonant circuit in accordance with one or more embodiments of the invention.

Programmable integrated circuits can include several different types of programmable logic blocks in the array. For example, FIG. 4 illustrates an FPGA architecture (400) that includes a large number of different programmable tiles including multi-gigabit transceivers (MGTs) 401, configurable logic blocks (CLBs) 402, random access memory blocks (BRAMs) 403, input/output blocks (IOBs) 404, configuration and clocking logic (CONFIG/CLOCKS) 405, digital signal processing blocks (DSPs) 406, specialized input/output blocks (I/O) 407, for example, e.g., clock ports, and other programmable logic 408 such as digital clock managers, analog to-digital converters, system monitoring logic, and so forth. Some FPGAs also include dedicated processor blocks (PROC) 410.

In some FPGAs, each programmable tile includes a programmable interconnect element (INT) 411 having standardized connections to and from a corresponding interconnect element in each adjacent tile. Therefore, the programmable interconnect elements taken together implement the programmable interconnect structure for the illustrated FPGA. The programmable interconnect element INT 411 also includes the connections to and from the programmable logic element within the same tile, as shown by the examples included at the top of FIG. 4.

For example, a CLB 402 can include a configurable logic element CLE 412 that can be programmed to implement user logic plus a single programmable interconnect element INT 411. A BRAM 403 can include a BRAM logic element (BRL) 413 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 406 can include a DSP logic element (DSPL) 414 in addition to an appropriate number of programmable interconnect elements. An IOB 404 can include, for example, two instances of an input/output logic element (IOL) 415 in addition to one instance of the programmable interconnect element INT 411. As will be clear to those of skill in the art, the actual I/O pads connected, for example, to the I/O logic element 415 are manufactured using metal layered above the various illustrated logic blocks, and typically are not confined to the area of the input/output logic element 415.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

In one embodiment, each MGT 401 is programmable to transmit and receive data over a wide range of programmable data rates. Each MGT 401 has a serializer/deserializer that includes a variable oscillator that includes a tunable resonant circuit. The oscillation frequency of the variable oscillator establishes the programmable data rate of its MGT 401. Because the frequency tuning range of the variable oscillator is extended in one or more embodiments of the invention, each MGT can operate at an extended range of programmable data rates.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic.

One or more embodiments of the present invention are thought to be applicable to a variety of tunable resonant circuits. Other aspects and embodiments will be apparent to those skilled in the art from consideration of the specification and practice of the one or more embodiments disclosed herein. The embodiments may be implemented as an application specific integrated circuit (ASIC) or in a programmable logic device. It is intended that the specification and illustrated embodiments be considered as examples only, with a true scope and spirit of the invention being indicated by the following claims.

What is claimed is:

1. A tunable resonant circuit, comprising:
   a first and second capacitor that each include a first and second electrode, wherein the first and second capacitors provide a matched capacitance between the first and second electrodes of the first capacitor and the first and second electrodes of the second capacitor;
   at least one deep-well arrangement that includes a first well disposed within a second well that is disposed within a substrate of an integrated circuit, wherein the first and second capacitors are each disposed on the first well of the at least one deep-well arrangement;

a first, second, and third transistor, each disposed in the integrated circuit and each including a gate electrode and two channel electrodes, wherein:
the two channel electrodes of the first transistor are respectively coupled to the second electrode of the first capacitor and the second electrode of the second capacitor;
the two channel electrodes of the second transistor are respectively coupled to the second electrode of the first capacitor and to ground, and the two channel electrodes of the third transistor are respectively coupled to the second electrode of the second capacitor and to ground; and
the gate electrodes of the first, second, and third transistors are responsive to a tuning signal; and
an inductor coupled between the first electrode of the first capacitor and the first electrode of the second capacitor.

2. The tunable resonant circuit of claim 1, wherein:
the first well of each deep-well arrangement is a p-type well and the second well of each deep-well arrangement is an n-type well; and
the substrate is a p-type substrate.

3. The tunable resonant circuit of claim 2, wherein the at least one deep-well arrangement includes only one deep-well arrangement and the first and second capacitors are disposed on the p-type well of the one deep-well arrangement.

4. The tunable resonant circuit of claim 2, wherein the at least one deep-well arrangement includes a first and second deep-well arrangement, and
the first capacitor is disposed on the p-type well of the first deep-well arrangement and the second capacitor is disposed on the p-type well of the second deep-well arrangement.

5. The tunable resonant circuit of claim 1, wherein:
the integrated circuit includes two metal layers separated by a dielectric layer, and the first and second capacitors each include the first electrode in one of the two metal layers and the second electrode in another one of the two metal layers;
the first capacitor provides the matched capacitance between the first and second electrodes of the first capacitor, and the second capacitor provides the matched capacitance between the first and second electrodes of the second capacitor; and
a resonance between the inductor and the first and second capacitors varies in response to the tuning signal.

6. The tunable resonant circuit of claim 1, wherein:
the first transistor differentially couples the first and second capacitors in response to a voltage difference between a control voltage of the tuning signal and a bias voltage at the two channel electrodes of the first transistor; and
the second and third transistors set the bias voltage to ground.

7. A tunable resonant circuit, comprising:
a plurality of pairs of first and second capacitors, each of the first and second capacitors of each pair including a first and second electrode, wherein the first and second capacitors of each pair provide a matched capacitance between the first and second electrodes of the first capacitor and the first and second electrodes of the second capacitor;
a plurality of respective switch sets for the plurality of pairs, the respective switch set for each pair including a first, second, and third transistor, each of the first, second, and third transistors including a gate electrode and two channel electrodes, wherein:
the two channel electrodes of the first transistor of the respective switch set for each pair are respectively coupled to the second electrode of the first capacitor of the pair and to the second electrode of the second capacitor of the pair;
the two channel electrodes of the second transistor of the respective switch set for each pair are respectively coupled to the second electrode of the first capacitor of the pair and to ground, and the two channel electrodes of the third transistor of the respective switch set for each pair are respectively coupled to the second electrode of the second capacitor of the pair and to ground; and
the gate electrodes of the first, second, and third transistors of the respective switch set for each pair are responsive to a respective one of a plurality of tuning signals; and
an inductor including two electrodes respectively coupled to the first electrode of the first capacitor of each pair and the first electrode of the second capacitor of each pair; and
a first varactor diode and a second varactor diode, each having an anode and a cathode, wherein:
the cathodes of the first and second varactor diodes are coupled together and to another tuning signal; and
the two electrodes of the inductor are respectively coupled to the anode of the first varactor diode and the anode of the second varactor diode.

8. The tunable resonant circuit of claim 7, wherein:
the matched capacitance of each pair of first and second capacitors has a respective magnitude of capacitance that is different from the respective magnitude of capacitance of each other pair of first and second capacitors; and
the plurality of pairs of the first and second capacitors are disposed in a layout order corresponding to a range from a minimum magnitude of capacitance to a maximum magnitude of capacitance of the respective magnitude of capacitance of the plurality of pairs.

9. The tunable resonant circuit of claim 8, wherein the respective magnitudes of capacitance of the plurality of pairs are binary weighted through the range.

10. The tunable resonant circuit of claim 8, wherein:
the first and second varactor diodes are disposed proximate to the pair having the minimum magnitude of capacitance, and the first and second varactor diodes are disposed distal from the pair having the maximum magnitude of capacitance.

11. The tunable resonant circuit of claim 8, wherein the inductor is disposed proximate to the pair having the minimum magnitude of capacitance, and the inductor is disposed distal from the pair having the maximum magnitude of capacitance.

12. The tunable resonant circuit of claim 11, further comprising a biasing circuit including a first and second plurality of current mirrors; wherein:
the inductor has a center tap and the biasing circuit is coupled to the center tap for providing a current bias;
the first plurality of current mirrors scale a reference bias to produce an operating-point bias in response to a corresponding plurality of scaling signals;
the second plurality of current mirrors scale the operating-point bias to produce the current bias in response to the plurality of tuning signals; and
the second plurality of current mirrors include a respective current mirror for each pair of the plurality of pairs, the respective current mirror compensating for a resistance through a series combination of the first capacitor of the pair, the first transistor of the respective switch set for the pair, and the second capacitor of the pair.

13. The tunable resonant circuit of claim 7, further comprising at least one deep-well arrangement that includes a p-type well disposed within a n-type well that is disposed within a p-type substrate of an integrated circuit, wherein the first and second capacitors of each pair are disposed on the p-type well of the at least one deep-well arrangement.

14. A circuit, comprising:
a plurality of pairs of first and second capacitors, wherein the first and second capacitors of each pair provide a matched capacitance;
a plurality of respective switch sets for the plurality of pairs, the respective switch set for each pair including a first transistor that selectively couples and decouples the first and second capacitors of the pair;
wherein the first transistor of the respective switch set for each pair is responsive to a respective tuning signal of a plurality of tuning signals;
an inductor, wherein, for each pair of the plurality of pairs, the inductor is coupled across a series combination of the first capacitor of the pair, the first transistor of the respective switch set for the pair, and the second capacitor of the pair;
two cross-coupled transistors, wherein the two cross-coupled transistors are coupled across the inductor; and
a biasing circuit including a first and a second plurality of current mirrors, wherein:
the first plurality of current mirrors scale a reference bias to produce an operating-point bias in response to a plurality of scaling signals;
the second plurality of current mirrors scale the operating-point bias to produce a current bias in response to the plurality of tuning signals; and
the inductor has a center tap and the biasing circuit is coupled to the center tap for providing the current bias to the two cross-coupled transistors.

15. The circuit of claim 14, wherein the second plurality of current mirrors includes:
a current mirror for setting the current bias to the operating-point bias in response to the plurality of tuning signals selectively decoupling the first and second capacitors of all of the plurality of pairs; and
a plurality of respective current mirrors for the plurality of pairs, the respective current mirror for each pair adding a scaling of the operating-point bias to the current bias in response to the respective tuning signal for the pair, wherein the scaling of the operating-point bias compensates for a resistance though the series combination for the pair in response to the respective tuning signal selectively coupling the first and second capacitors of the pair.

16. The circuit of claim 14, wherein the respective switch set for each pair further includes a second and third transistor that set a bias voltage of the first transistor of the respective switch set, and the first transistor selectively couples the first and second capacitors of the pair in response to a control voltage of the respective tuning signal exceeding the bias voltage by more than a threshold voltage of the first transistor.

17. The circuit of claim 14, wherein:
a plurality of binary weighted magnitudes of capacitance are associated with the plurality of pairs, the matched capacitance of the first and second capacitors of each pair having the binary weighted magnitude of capacitance associated with the pair;
the plurality of pairs of the first and second capacitors are disposed in a layout order corresponding to a range from a minimum magnitude of capacitance to a maximum magnitude of capacitance of the plurality of binary weighted magnitudes of capacitance associated with the plurality of pairs; and
wherein the inductor is disposed proximate the pair to which the minimum magnitude of capacitance is associated, and the inductor is disposed distal from the pair to which the maximum magnitude of capacitance is associated.

18. The circuit of claim 14, further comprising two varactor diodes coupled in a series combination wherein the inductor is coupled across the series combination, and the two varactor diodes are responsive to another tuning signal coupled between the two varactor diodes in the series combination.

19. The circuit of claim 14, further comprising at least one deep-well arrangement that includes a p-type well disposed within a n-type well that is disposed within a p-type substrate of an integrated circuit, wherein the first and second capacitors of each pair are disposed on the p-type well of the at least one deep-well arrangement.

* * * * *